United States Patent [19]

Stridsberg

[11] Patent Number: 5,558,504
[45] Date of Patent: Sep. 24, 1996

[54] MAGNETOSTRICTIVE PUMP FOR APPLYING PASTES AND ADHESIVES

[75] Inventor: Lennart Stridsberg, Enskede, Sweden

[73] Assignee: Mydata Automation AB, Sweden

[21] Appl. No.: 338,364

[22] Filed: Nov. 14, 1994

Related U.S. Application Data

[63] Continuation of Ser. No. 934,522, filed as PCT/SE91/00094 Feb. 12, 1991, published as WO91/12106, Aug. 22, 1991, abandoned.

[30] Foreign Application Priority Data

Feb. 12, 1990 [SE] Sweden ................. 9000502

[51] Int. Cl.⁶ ................. F04B 7/04; F04B 19/02
[52] U.S. Cl. ................. 417/322; 417/461; 417/469; 417/509; 417/510
[58] Field of Search ................. 417/322, 395, 417/509, 461, 466, 469, 510

[56] References Cited

U.S. PATENT DOCUMENTS

| | | | |
|---|---|---|---|
| 1,295,211 | 2/1919 | Riedler | 417/509 |
| 2,118,578 | 5/1938 | Trapp | 417/509 |
| 2,258,426 | 10/1941 | Smith | 417/509 |
| 2,353,188 | 7/1944 | Roosa | 417/509 |
| 3,288,071 | 11/1966 | Anderson | 417/395 |
| 3,683,212 | 8/1972 | Zoltan | 417/322 |
| 4,036,326 | 7/1977 | Mukai et al. | 417/461 |
| 4,726,741 | 2/1988 | Cusack | 417/322 |
| 4,795,318 | 1/1989 | Cusack | 417/322 |
| 4,804,314 | 2/1989 | Cusack | 417/322 |
| 4,815,946 | 3/1989 | Cusack | 417/322 |
| 4,828,886 | 5/1989 | Hieber . | |
| 5,074,757 | 12/1991 | Horn | 417/395 |

FOREIGN PATENT DOCUMENTS

| | | | |
|---|---|---|---|
| 119 | 8/1899 | Austria | 417/466 |
| 2717578 | 11/1978 | Germany | 417/322 |
| 3007001 | 9/1981 | Germany | 417/322 |
| WO90/00852 | 1/1990 | WIPO . | |

Primary Examiner—Richard A. Bertsch
Assistant Examiner—Roland G. McAndrews, Jr.
Attorney, Agent, or Firm—Townsend and Townsend and Crew

[57] ABSTRACT

A device is proposed for applying material such as solder paste and glue in discrete points, particularly for applying solder paste on electronic circuit boards. The device comprises a pump house (202–205; 301, 307), a tube or a channel (206) by means of which material is fed to the pump house, a nozzle (111, 205) for feeding material from the pump house (202–205; 301, 307). Suitable upper and lower valve devices are arranged to block, at predetermined times, the feeding of material to and from the pump house (202–205; 301, 307). The lower valve device may possibly be replaced by a restriction device. As is conventional the pump house (202–205; 301, 307) comprises an outer pump cylinder (203; 307) and an inner piston (204; 301). The displacement of the piston (201; 301) is obtained by the fact that the piston is connected to a magnetostrictive rod (202; 308). This rod (202; 308) cooperates with a coil (208) arranged around the rod (202; 308). When an electric current is fed to this coil (208) the length of the rod will increase. A very rapid application of the material is achieved.

13 Claims, 2 Drawing Sheets

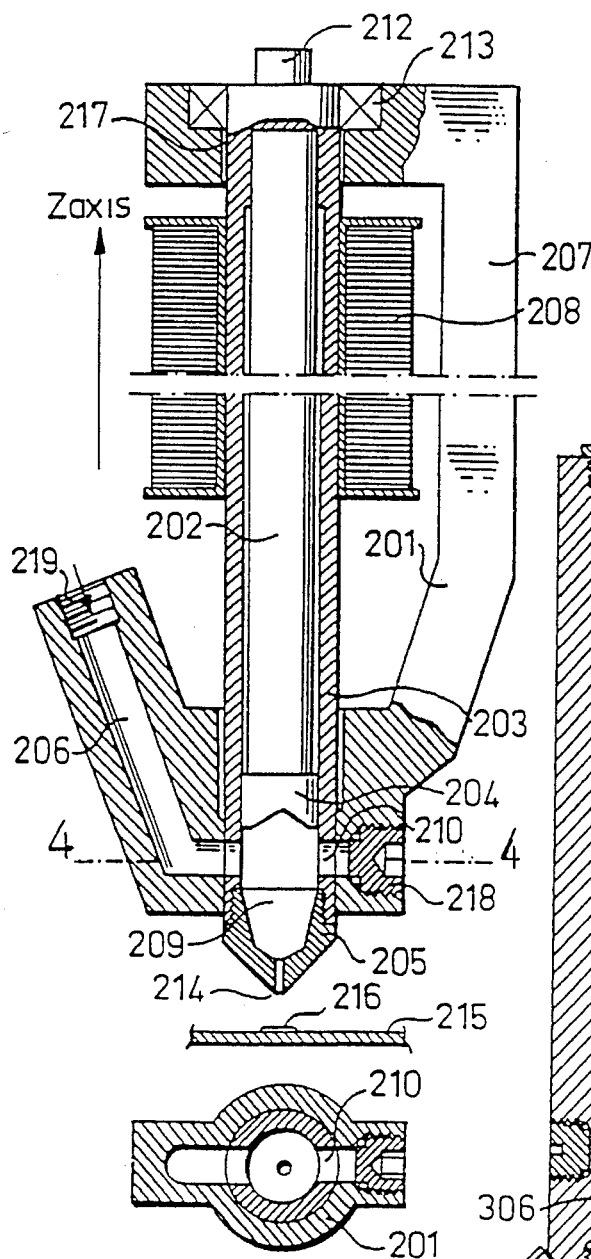
Fig. 2
Fig. 4
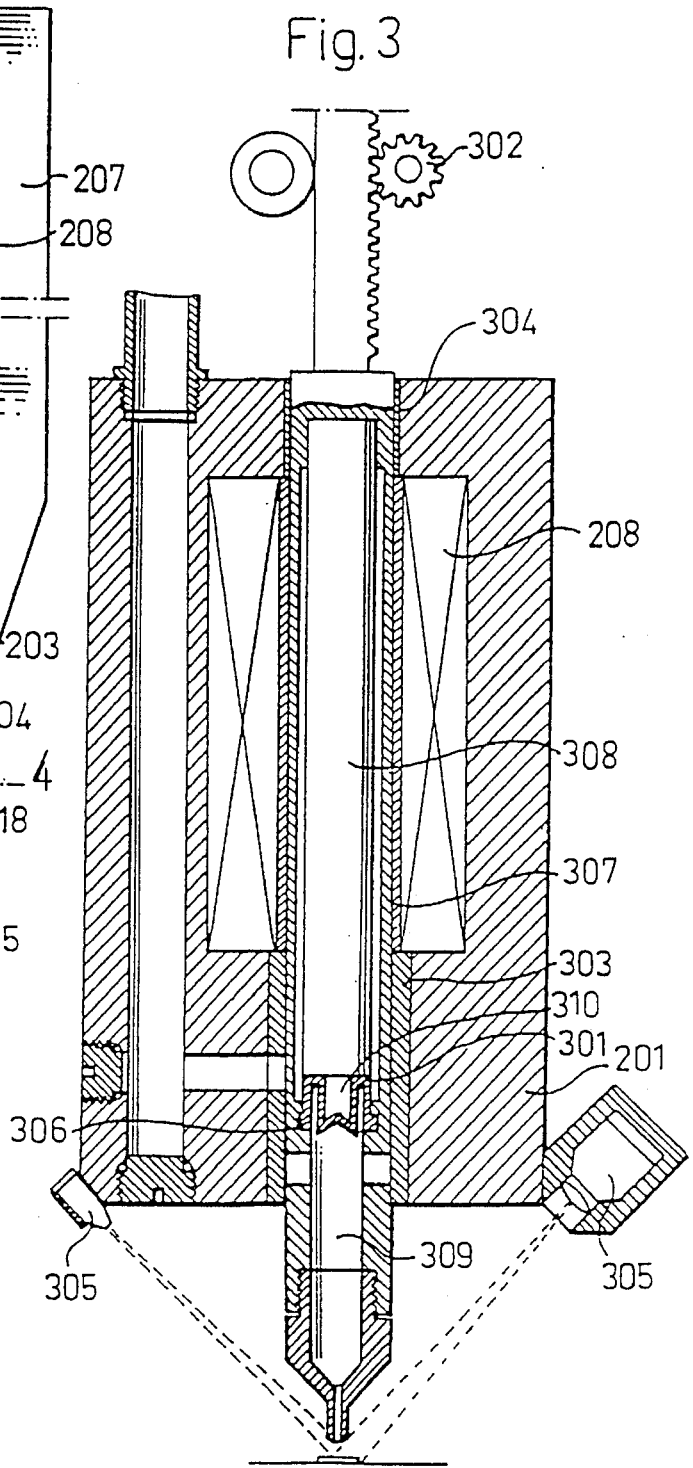
Fig. 3

MAGNETOSTRICTIVE PUMP FOR APPLYING PASTES AND ADHESIVES

This is a continuation of application Ser. No. 07/934,522, filed as PCT/SE91/00094 Feb. 12, 1991 published as WO91/12106 Aug. 22, 1991, now abandoned.

BACKGROUND OF THE INVENTION

This invention primarily concerns a method and a device for applying solder paste, glue and other materials on a printed circuit board, ceramic substrate or other base materials for building up electronic circuits.

Since the invention is suited for applying and metering many different materials besides solder paste and glue the word "Material" will be used in the following, to mean the various materials and substances to which the invention is applicable.

The conventional method used to apply solder paste on a circuit board is screen printing using stenciles or screens. These methods have considerable disadvantages due to the comparatively high costs associated with —production cost of new screens for new circuit boards; even the slightest change of a circuit board will require a completely new screen, —set up time to find, insert and adjust the screen in the screen printer.

These costs are normally negligible in long series production but in short series production they become a serious problem. A purpose of this invention is to provide a method and a means to enable short series production using solder paste on substrates and boards.

The principal purpose of the invention is to provide a device which will make it possible to apply solder paste, glue or other materials in small points or on specified small areas built up of several points, having a volume, which can be chosen within certain limits, with a good repeatability for the volume chosen and to do so with a very high speed.

This is accomplished with a method and a device, the particular features of which appear from the accompanying claims.

SUMMARY OF THE INVENTION

A method is provided for the application of Material by means of a pumping device comprising a pumping chamber connected to a nozzle. The volume of this pumping chamber is made to vary, particularly to be reduced, by the use of the magnetostrictive effect. Therefor one of the walls of said pumping chamber is connected to or is constituted by a part having a high magnetostrictive effect. The dimensions of this part is changed by the fact that the magnetic field is changed as by means of an electric coil located around said part. This part preferably is a rod having an elongated cylindrical shape which is at least partly enclosed by a concentrically located electric coil.

Thus a device is provided for applying Material such as solder paste and glue in discrete points, particularly for placing soldering paste on electronic circuit boards and the device may cooperate with a following mounting machine, or alternatively it may be included in a combined machine able to first apply for example solder paste and then to mount components on the same solder islands or pads.

The applying device comprises a pump house and Material is fed from a container to said pump house by means of a pipe. Furthermore, there is a nozzle to feed said material out from the pump house. The feeding in of Material is suitably produced by means of a pressure above the atmospheric pressure acting on the Material inside the Material container and the feeding into said pump house is controlled by an upper valve device. This upper valve device will at predetermined times block the input of material to the pumping chamber which is located inside the pump house. In order to control the feed out from the pumping chamber a lower valve device may be provided adjacent to the outlet of the pumping device; however, in many cases a suitable restriction device located there is sufficient to ensure proper operation. The essential part of the pump house, which performs the pumping operation, is built of an outer pump cylinder and an inner piston moved by length changes of a rod made of a material with a large magnetorestrictive effect. Around the rod a coil is located. By controlling the current through this coil, the inner volume of the pumping chamber can be controlled, as the length of the rod will change or increase with the magnetic field or the increasing magnetic field respectively. After the pumping device and the optional lower valve device, as taken in the flow direction of the Material, there is an eject nozzle to feed said material out from the pump system. The construction of the device permits rapid changes of the inner volume of the pump house. This will for some Materials make it possible to eject separate droplets of Material from the nozzle with a speed high enough to make it possible to direct the Material to the target surface while the nozzle of the total device is located at a distance from the target surface. This enables the system to work with high dot frequencies, giving a high capacity.

The upper valve device can be arranged in several different ways. A possible construction is that the pump house is arranged to be displaced in relation to said material inlet openings in such a way that the house in some positions will close these and in some positions will maintain these open in a direction towards the pumping chamber. In one embodiment the upper valve is accomplished by having the pump house, both cylinder and piston, perform angular movements around their common longitudinal axis, the channels enabling the feed of Material from a sleeve surrounding the pumping house for some angles being open for feeding Material and in other cases are closed to enable that the ejection movements of the pumping piston will be effective and that Material can be ejected. In another embodiment the pump house performs linear movements relative to the sleeve; in one position the material feeding channels in the sleeve are in contact with the material receiving openings in the pumping house, the upper valve device being open, and in another position the entire pump house including the eject nozzle is displaced into a position suitable for ejection of Material, the upper valve device being closed. A third embodiment includes a third moving element that can be moved in such a way to either open or close the upper valve device.

BRIEF DESCRIPTION OF THE DRAWINGS

The invention will now be more closely described with reference to the accompanying figures, where

FIGS. 2 shows an embodiment of a Material applying pump system according to the invention where the upper valve function is obtained by angular movements of the pump house, partly as seen in a longitudinal section, partly in a cross section.

FIG. 3 shows an embodiment of a Material applying pump system according to the invention where the upper valve function is obtained by a linear movement of the pump house.

FIG. 4 shows a sectional view taken along lines 4—4 of FIG. 2.

DESCRIPTION OF THE PREFERRED EMBODIMENT

Figure 1:
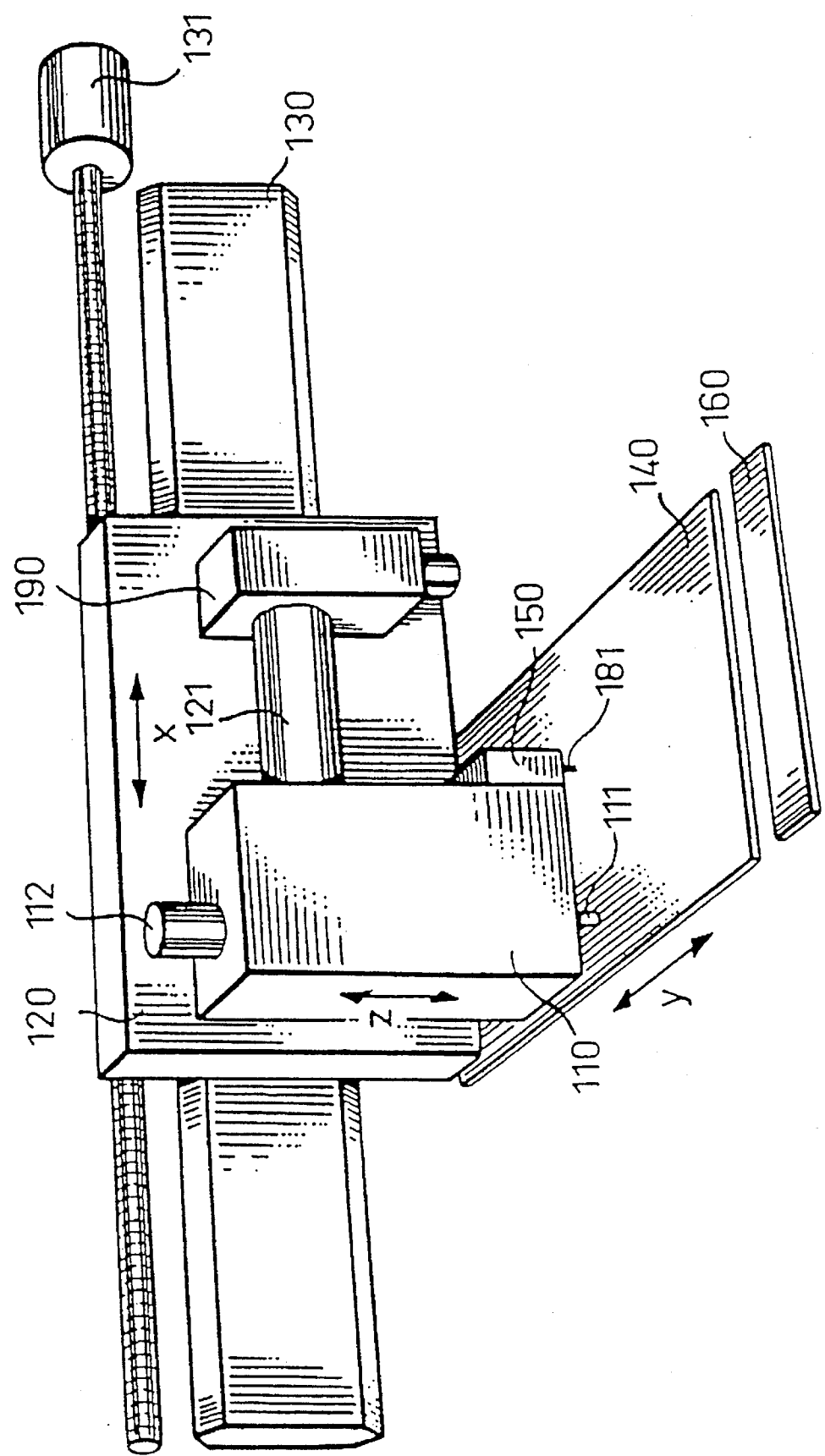
FIG. 1 shows an embodiment of a glue and soldering paste applying or dispensing machine according to the invention.

FIG. 1 shows a possible embodiment of a machine according to the invention. The main part of the machinery is the pump system. This is mounted on a carriage 120, which is movable along a path 130 and can be transported in the x-direction along this path by means of a motor 131. The exact realization of the said means 130-131 is not essential to the invention.

The Material is ejected by means of a nozzle 111 towards the target 140, which may be a printed circuit board. The Material is preserved in a container 112.

Apparently said board must be able to be displaced in the y-direction in relation to the path 130. If this is produced by the method that the path or the board is movable in the y-direction, is not relevant to the invention.

For a correct operation said head 110 is movable in the z direction by means of a motor 121. To be able to directly measure the vertical level of said board a distance finder 150 is provided. In the embodiment shown this comprises a feeler means 181, which may be temporarily lowered to check the distance between said head 110 and the board 140.

A camera 190 is used for locating reference points on said board in such a way that the associated control system can make corrections for boards which have been placed obliquely or have been mounted displaced in the x- or y-directions, and to make corrections for the fact that the soldering islands are not exactly oriented in relation to the borders of said board.

FIG. 2 shows an embodiment of the invention in two views. The lower view shows a projection along the line A—A in the upper view and the upper view shows a projection along the line B—B in the lower view. In this embodiment there is no lower valve device and the upper valve device is based on a rotative movement of the pump house.

The main parts of the pumping device are a sleeve 201, a magnetostrictive rod 202, a pump cylinder 203, a piston 204 and an eject nozzle 205. The rod 202 and the cylinder 203 are mechanically rigidly attached to each other in their upper parts. Above, and in the following, the parts 202, 203, 204, are called the "pump house". In the sleeve there is a Material feeding channel 206 into which Material is fed through the inlet 219 under overpressure from a container, tube or some other means irrelevant to the invention. The sleeve 201 is mechanically connected to a part 207 and together they constitute the frame of the pump system. The pumping action is obtained by changing the current through the coil 208 which will induce a change in the length of the rod 202, thus changing the position of the piston 204 and thereby changing the volume of the pump chamber 209. The rod 202 is preferably made of a material having very high magnetostrictive effect like $Tb_{0.27}Dy_{0.73}Fe_{1.95}$.

In the embodiment shown in FIG. 2 the upper valve device is obtained by a rotating movement of the pump house 202-204. In the lower view of FIG. 2 the rotation angle of the pump house is such that Material can flow through the pump house openings 210 into the pump chamber 209. By rotating the pump house 202-204 approximatively 90 degrees the openings 210 will face the solid wall of the sleeve 201 and this will thus act as a closed valve. The rotation may be controlled by a motor connected to the shaft 212 through a coupling, a toothed belt, a pinion or another torque transmitting device and is not relevant to the invention.

For most applications it will be necessary to arrange a z-movement of the pumping device to be able to adjust the distance between the pumping device nozzle 214 and the target. In FIG. 1 this is arranged by the motor 121. In FIG. 2 the target is illustrated as a printed circuit board 215 with a solder island 216 (140 in FIG. 1). Assuming that the necessary stroke of the z-movement is fairly small, the coil 208 may be stationary and the z-movement limited to the pump house 202-204 and the sleeve-frame 201 and 207 and its associated rotation mechanism.

The sleeve 201, the frame portion 207 and the rod 202 constitute a partially closed magnetic circuit.

By removing the Material feeding device connected to the Material entry point 219, unscrewing the nozzle part 204 and removing the bolt 218, the total pumping device can be cleaned. For Materials requiring a constant temperature the sleeve 201 can be temperature controlled using its compact form to obtain an even temperature and by connecting internal or external coolant air or tubes containing a cooling fluid (not included in the drawings).

If the play between the sleeve 201 and the cylinder 203 is very small even slight bends of the pump house 202-204 will cause tensions between the bearing 213 and the bearing constituted of said small play. This can be eliminated by increasing the inner radius of the bore in the sleeve 201 in the parts not vital to the upper valve device function and by letting the ball bearing 213 have a large play.

In the FIG. 2 the openings 210 are circular and are completely open relative to the corresponding opening in the sleeve only in two positions during one whole revolution. Depending on the properties of the Material, the openings can be larger covering a substantial part of one half revolution. It is also possible to use four or six openings 210. An even number is preferable to facilitate cleaning by removing the bolt 218.

FIG. 3 shows another embodiment of the invention. The pump house is almost identical; however, as the stroke of the rod is very small—in the order of 140 µm for a 100 mm rod—the piston 301 is here made of an elastic material like rubber with a tight joint to the cylinder 307. The piston 301 is shown as a flexible diaphragm provided with beads which are retained in a corresponding annular recess in the interior of the pumping cylinder.

In FIG. 2 the inner diameter of the cylinder 203 is the same in the part constituting the pumping chamber 209 as in the part containing the rod 202. In other embodiments of the invention these two diameters can be different and this is also illustrated in FIG. 3. Here the upper part of the cylinder 307, in which the main portion of the pump rod 308 is located, is provided to have a larger diameter than the lower part, which constitutes the cylindrical walls of the pumping chamber 309. At the transition between the upper and lower part the annular groove 306 is located wherein said beads 306 are retained. In this way the diaphragm-like piston 301 will be arranged at the connection of said portions having different diameters. In addition the pump rod 308 is provided with a short front portion 310 extending into the lower portion having a smaller diameter and thus also this front portion is arranged to have a smaller diameter than the remaining rear part of the pump rod 308.

In FIG. 3, the arrangement of the upper valve device is different in that the movement used to open or close the upper valve is linear and is performed in the longitudinal direction of the rod 308 and the cylinder 307. This is in the embodiment shown in FIG. 3 arranged by a pinion 302. The pinion is driven by a motor (not shown). The exact realization of height movement system is not essential to the invention, and can be arranged using rotary motors and pinion as shown, a voice coil actuator, etc. The exact realization of the linear bearings guiding the movements of the pump house is neither essential to the invention. In FIG. 3 two bushings 303 and 304 are used.

If the stroke of the vertical movements of the nozzle required to avoid damage while moving over the board is small, the pumping device according to FIG. 3 can be vertically fixed in the machine, i.e. on the carriage 120 in FIG. 1. This reduces the cost as the motor 121 otherwise necessary can be eliminated.

FIG. 3 also illustrates another device to check the distance to the board. In this case a conventional laser triangulation device 305 (like, for example, those marketed by Newport GmbH) is used to find the distance from the solder island 216 to the sleeve frame 201. The use of such a distance ranging device together with the embodiment of the invention according to FIG. 3 also gives the advantage that the nozzle rapidly can be lowered to almost touch the target 216 while keeping a small distance suitable to put short lines of solder paste on the comparatively long solder islands used for Quad pack IC:s. In such a case the nozzle must be moved horizontally over the solder island and the piston 301 must be advanced slowly proportional to the horizontal movement. This can be accomplished by linearily increasing the current through the coil 208.

I claim:

1. A device for applying a relatively viscous material in discrete points to a point board, comprising:

a pump house comprising:
  a pumping chamber having an outlet;
  a piston contained within the pump house; and
  a magnetostrictive rod arranged to displace the piston by a change in a length of the rod;
a channel configured to feed a material to the pump house;
a nozzle comprising a restriction, the nozzle being rigidly attached to the pump house and configured to discharge the material from the pumping chamber;
a coil positioned around the rod;
an opening extending into the pumping chamber; and
a valve device connected to at least one of said channel and said pumping chamber, the valve device being arranged to block, at predetermined times, a material flow between the channel and the pumping chamber, the valve device having means for displacing the pump house between a first position, in which the material flow is permitted from the channel into the pumping chamber and through the opening, and a second position, in which the opening is not fluidly coupled to the channel and the material flow between the channel and the pumping chamber is blocked.

2. The device of claim 1, wherein:

the displacing means comprises means for rotating the pump house.

3. The device of claim 1 wherein:

the pumping chamber further comprises a longitudinal axis oriented parallel to a movement direction of the piston; and the displacing means comprises means for translating the pump house in a direction of the longitudinal axis.

4. The device of claim 1, wherein:

a side of the piston limits and forms a wall of said pumping chamber and an other side of the piston is connected to the magnetostrictive rod.

5. The device of claim 1, wherein:

the piston and the magnetostrictive rod are arranged to move inside the pump cylinder.

6. The device of claim 1, wherein:

the magnetostrictive rod comprises an end connected to the pump cylinder.

7. The device of claim 1, wherein:

the coil encloses at least a part of the pump cylinder.

8. A device for applying a relatively viscous material in discrete points to a point board, comprising:

a pump house comprising:
  a pumping chamber having an outlet;
  an outer pump cylinder contained within the pump house, the pump cylinder having an inner diameter, the inner diameter being different in a first part and a second part, the first part constituting a wall of the pumping chamber and the second part containing the magnetostrictive rod;
  a piston contained within the pump house; and
  a magnetostrictive rod arranged to displace the piston by a change in a length of the rod;
a channel configured to feed a material to the pump house;
a nozzle comprising a restriction, the nozzle being configured to discharge the material from the pumping chamber;
a coil positioned around the rod;
an opening extending into the pumping chamber; and
a valve device connected to at least one of said channel and said pumping chamber, the valve device being arranged to block, at predetermined times, a material flow between the channel and the pumping chamber, the valve device having means for displacing the pump house between a first position, in which the material flow is permitted from the channel into the pumping chamber and through the opening, and a second position, in which the opening is not fluidly coupled to the channel and the material flow between the channel and the pumping chamber is blocked.

9. A device for applying a relatively viscous material in discrete points to a board, comprising:

a pump cylinder;
a pump chamber located inside the pump cylinder and having a cylindrical wall, a first end wall, a second end wall and a longitudinal axis therebetween;
a piston being reciprocally mounted within the pump cylinder and having a reciprocal motion, the piston having a piston end wall forming the first end wall of the pumping chamber;
a channel having means for feeding a material to the pumping chamber;
an outlet nozzle connected to the pumping chamber and configured to discharge the material;
an inlet valve device connected to at least one of said channel and said pumping chamber, the inlet valve device being movable between a first position, in which a material flow between the channel and pumping chamber is prevented, and a second position, in which the material flow between the channel and the pumping chamber is permitted;

a magnetostrictive device arranged to drive the piston in the reciprocal movement within the pump cylinder, the reciprocal movement having a very small stroke length relative to a longitudinal length of the piston, the reciprocal movement being parallel to the longitudinal axis of the cylindrical wall of the pumping chamber;

the pumping chamber also having an inlet and an opening, the inlet being connected to the channel and the opening extending through the cylindrical wall of the pumping chamber, the outlet nozzle forming the second end wall of the pumping chamber; and the reciprocal movement of the piston being limited so that the piston does not cover the opening during the reciprocal movement.

10. The device of claim 9, wherein:

the magnetostrictive device comprises a magnetostrictive rod; and the piston is attached to the cylindrical wall of the pumping chamber and the magnetostrictive rod.

11. The device of claim 10, wherein:

the pump cylinder comprises an inner diameter having a first part and a second part, the first part comprising the cylindrical wall of the pumping chamber and the second part enclosing the magnetostrictive rod.

12. A device for applying a material, comprising:

a pump house;

a pump cylinder disposed within the pump house and having a pumping chamber, the pumping chamber including a nozzle having a restriction;

a magnetostrictive rod having an end and being positioned within the pump cylinder;

a coil positioned around the magnetostrictive rod for changing a magnetic field around the magnetostrictive rod to thereby change a length of said rod;

a piston coupled to the end of the magnetostrictive rod;

a channel configured to feed a material to the pumping chamber;

the pump house having an opening therethrough, the opening being coupled fluidly coupled to the pumping chamber; and means for adjusting the position of the opening with respect to the channel, the adjusting means being adjustable between a first position, in which the channel and the pumping chamber are fluidly coupled through the opening, and a second position, in which the opening is not fluidly coupled to the channel so that a material flow between the channel and pumping chamber is blocked.

13. A device for applying a material, comprising:

a pump house;

a pump cylinder disposed within the pump house and having a pumping chamber, the pumping chamber including a nozzle having a restriction;

a magnetostrictive rod having an end and being positioned within the pump cylinder;

a coil positioned around the magnetostrictive rod for changing a magnetic field around the magnetostrictive rod to thereby change a length of said rod;

a piston coupled to the end of the magnetostrictive rod;

a channel configured to feed a material to the pumping chamber;

the pump house having an opening therethrough, the opening being fluidly coupled to the pumping chamber;

means for adjusting the position of the opening with respect to the channel, the adjusting means being adjustable between a first position, in which the channel and the pumping chamber are fluidly coupled through the opening, and a second position, in which the opening is not fluidly coupled to the channel so that a material flow between the channel and pumping chamber is blocked; and the nozzle being directly fluidly coupled to the pumping chamber and to an ambient environment so that the material has an unobstructed path from the pumping chamber to a target site.

\* \* \* \* \*